United States Patent
Cho et al.

(10) Patent No.: US 7,236,393 B2
(45) Date of Patent: Jun. 26, 2007

(54) PHASE-CHANGE SEMICONDUCTOR MEMORY DEVICE AND METHOD OF PROGRAMMING SAME

(75) Inventors: Beak-hyung Cho, Hwaseong-si (KR); Choong-keun Kwak, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 11/254,853

(22) Filed: Oct. 21, 2005

(65) Prior Publication Data

US 2006/0087877 A1   Apr. 27, 2006

(30) Foreign Application Priority Data

Oct. 26, 2004   (KR) .................... 10-2004-0085801

(51) Int. Cl.
*G11C 11/00* (2006.01)
(52) U.S. Cl. ..................... 365/163; 365/148
(58) Field of Classification Search ................ 365/163, 365/148
See application file for complete search history.

(56) References Cited

U.S. PATENT DOCUMENTS

| | | | |
|---|---|---|---|
| 6,487,113 B1 * | 11/2002 | Park et al. ............... | 365/163 |
| 6,687,153 B2 * | 2/2004 | Lowrey ..................... | 365/163 |
| 6,982,913 B2 * | 1/2006 | Oh et al. ................... | 365/203 |
| 7,075,841 B2 * | 7/2006 | Resta et al. ............... | 365/203 |
| 7,085,154 B2 * | 8/2006 | Cho et al. ................. | 365/163 |
| 7,139,196 B2 * | 11/2006 | Tran ......................... | 365/185.21 |
| 2004/0114428 A1 | 6/2004 | Morikawa | |

FOREIGN PATENT DOCUMENTS

| | | |
|---|---|---|
| EP | 1326254 | 7/2003 |
| JP | 15-229537 | 8/2003 |

\* cited by examiner

*Primary Examiner*—Tuan T. Nguyen
(74) *Attorney, Agent, or Firm*—Volentine & Whitt, PLLC

(57) ABSTRACT

A semiconductor memory device and a method of programming the same, the semiconductor memory device includes a plurality of memory cells, each of the memory cells having a plurality of phase change variable resistors and a selection transistor. Each of the phase change variable resistors has a first end connected to one of a plurality of bit lines and a second end connected to a drain of the selection transistor. The selection transistor has a gate connected to a word line and a source connected to a reference voltage. The memory device is programmed by activating a word line associated with a selected memory cell, thereby turning on the selection transistor, applying a reset pulse to bit lines of the selected memory cell, and applying a set pulse to selected bit lines of the selected memory cell.

21 Claims, 4 Drawing Sheets

PHASE-CHANGE SEMICONDUCTOR MEMORY DEVICE AND METHOD OF PROGRAMMING SAME

BACKGROUND OF THE INVENTION

1. Field of the Invention

The present invention relates to a semiconductor memory device and a method of programming the same. More particularly, the invention relates to a semiconductor memory device comprising a plurality of memory cells, each including a selection transistor and a plurality of phase change variable resistors and a method of programming same.

A claim of priority is made to Korean Patent Application No. 10-2004-0085801 filed on Oct. 26, 2004, the disclosure of which is hereby incorporated by reference in its entirety.

2. Description of the Related Art

A Phase-Change Random Access Memory (PRAM) is a device that stores data using a phase change material such as a chalcogenide alloy that changes into one phase under some heating and cooling conditions, and changes into another phase under different heating and cooling conditions. Typically, the two phases respectively comprise a crystalline phase and an amorphous phase. A PRAM is disclosed, for example, in U.S. Pat. Nos. 6,487,113 and 6,480,438.

A PRAM has a low resistance value when in the crystalline phase and a high resistance value when in the amorphous phase. Accordingly, a logic state for the PRAM is determined to be either "0" or "1" depending on its resistance value. Generally, the crystalline phase of the PRAM corresponds to a programmed state, i.e., a logical "0", and the amorphous phase corresponds to a reset state, i.e., a logical "1".

The PRAM is changed into an amorphous phase by heating it to a temperature greater than a melting temperature of the phase change material and then rapidly cooling it down. The PRAM is changed into the crystalline phase by heating it to a temperature lower than the melting temperature of the phase change material for a predetermined length of time.

The phase change material used to form the PRAM plays an important role in the PRAM's functionality. The phase change material is typically composed of chalcogenide, which is an alloy composed of germanium (Ge), antimony (Sb), and tellurium (Te), or in other words, a GST alloy. Where the GST alloy is heated or cooled, its state changes between the amorphous state (reset state) and the crystalline state (set state). By using the amorphous state and the crystalline state to represent different logic states, i.e., a logical "1" and a logical "0", the GST alloy can be used to form a memory device.

A memory cell formed of chalcogenide typically includes an upper electrode, a chalcogenide layer, a lower electrode contact, a lower electrode, and an access transistor. Data is read from the memory cell by measuring a resistance value of the chalcogenide layer. The memory cell is programmed by changing the chalcogenide layer between the amorphous, or reset state, and the crystalline, or set state.

To write a logical "1" to the memory cell, the chalcogenide layer is heated to a temperature greater than or equal to its melting temperature and then rapidly cooled down, thereby changing the chalcogenide layer to the amorphous state. To write a logical "0" to the memory cell, the chalcogenide layer is maintained at a temperature below its melting temperature, and then cooled down, thereby causing the chalcogenide layer to assume the crystalline state.

FIG. 1 is a circuit diagram of a conventional phase change memory cell 10 disclosed in U.S. Pat. No. 5,883,827. Memory cell 10 includes a phase change variable resistor "R" having one end connected to a bit line BL and another end connected to a drain of a selection transistor N10. Selection transistor N10 has a gate connected to a word line WL and a source connected to a reference voltage (not shown).

FIG. 2 is a circuit diagram of a non-volatile phase change memory cell 30 disclosed in U.S. Patent Publication No. 2004/0114428. Memory cell 30 includes a plurality of variable resistors, each having one end connected to a corresponding bit line BL and another end connected to a drain of a selection transistor N30. Selection transistor N30 has a gate connected to a word line WL and a source connected to a reference voltage (not shown) via a source line SL.

U.S. Patent Publication No. 2004/0114428 teaches that memory cell 30 may be a resistance control nonvolatile random access memory, a magnetic RAM, or an Ovonic Unified Memory (OUM). However, it does not teach a circuit construction on which a programming or read operation for the phase change memory cell may be performed, nor does it teach a method of programming the phase change memory cell.

Accordingly, there is a need for a circuit construction adapted for reading and programming a PRAM and methods of programming the PRAM. In addition, in order for the PRAM, which has attracted attention as a next-generation memory, to compete with existing memory devices such as DRAM, SRAM, and flash memory, the PRAM needs to become more highly integrated, so as to become smaller and faster.

SUMMARY OF THE INVENTION

In one aspect the present invention a memory cell adapted for use in a PRAM, wherein each memory cell comprises a grouped plurality of phase change variable resistors. In one embodiment of the invention, the number of phase change variable resistors within each grouped plurality of phase change variable resistors is equal to some whole number multiple of eight.

The invention also provides a method of programming memory cells in a PRAM. Here again, one embodiment of the invention provides a grouped plurality of phase change variable resistors, preferably including a number of phase change variable resistors equal to some whole number multiple of eight.

According to one aspect of the invention, there is provided a semiconductor memory device, such as a PRAM, comprising a plurality of phase change memory cells, wherein each of the phase change memory cells includes a plurality of phase change variable resistors, each having one end connected to one if bit lines and the other end connected to a drain of a selection transistor, the number of the phase change variable resistors being a while number multiple of 8; and the selection transistor having a gate connected to a corresponding word line and a source connected to a reference voltage.

The semiconductor memory device further comprises column selection transistors, each connected between one of the bit lines and a data line, wherein during a read operation, a column selection transistor, which corresponds to a phase change memory cell from which data is to be read, is turned on in response to a column block signal and outputs the data to the data line.

The column bock signal is activated in response to an address signal which indicates that the phase change memory cell from which data is to be read. The number of the phase change variable resistors may in certain embodiments be equal to the number of the column selection transistors. In two presently preferred embodiments the number is 16 or 32.

In another aspect of the invention, the phase change variable resistors may be formed from one or more materials selected from a group consisting of germanium (Ge), antimony (Sb), and tellurium (Te). In one embodiment, the phase change variable resistors may be deposited directly on a semiconductor substrate. In another embodiment, the phase change variable resistors may be deposited on the selection transistor.

In another aspect, the invention provides a semiconductor memory device further comprising a write circuit controlling reset programming and set programming, wherein during reset programming, the write circuit applies a reset pulse to all phase change variable resistors of a selected phase change memory cell in response to a reset control signal, and during set programming, the write circuit resets the selected phase change memory cell and applies a set pulse to the selected phase change memory cell in response to a set control signal.

The semiconductor memory device may still further comprise a write circuit controlling reset programming and set programming, wherein the write circuit includes a plurality of column selection control circuits selects one of the phase change memory cells, on which a write operation or a read operation is to be performed, in response to the column block signal, and controls a set pulse or a reset pulse to be applied to a plurality of phase change variable resistors of the selected phase change memory cell in response to a write data pulse; and a read/write circuit receiving the reset control signal, the set control signal, and data, and generating the write data pulse, the set pulse, and the reset pulse.

Each of the column selection control circuits may comprise a plurality of NOR operation units, each performing a NOR operation on the column block signal and a corresponding write data pulse to turn on or off one of the column selection transistors.

The number of the NOR operations of each of the column selection control circuits is equal to the number of phase change variable resistors of the phase change memory cell selected in response to the column block signal.

During one exemplary reset programming operation, each of the column selection control circuits activates a column block signal corresponding to an address signal, which is to be reset programmed, and all write data pulses to turn on all corresponding column selection transistors. During one exemplary set programming operation, each of the column selection control circuits reset programs a phase change memory cell which is to be set programmed, and activates a column block signal corresponding to an address signal, which is to be set programmed, and a write data pulse corresponding to a phase change variable resistor of a phase change memory cell, which is to be set programmed, to turn on corresponding column selection transistors.

In the foregoing context, the bit line may be pre-charged in response to the set control pulse.

According to another aspect of the present invention, there is provided a method of programming a semiconductor memory device having memory cells, each memory cell including a selection transistor and a plurality of phase change variable resistors, the number of phase change variable resistors being a multiple of 8, the method comprising reset programming all phase change variable resistors of a selected memory cell; and selectively set programming the selected phase change variable resistors.

According to yet another aspect of the present invention, there is provided a method of reset programming several of phase change variable resistors of a memory cell of a semiconductor memory device and set programming the other phase change variable resistors, wherein the memory cell includes a selection transistor and a plurality of phase change variable resistors and the number of phase change variable resistors is a multiple of 8. The method comprises reset programming all phase change variable resistors of a selected memory cell; and selectively set programming parts of the reset programmed phase change variable resistors, which are to be set programmed.

According to still another aspect of the present invention, there is provided a method of set programming a semiconductor memory device with memory cells, each including phase change variable resistors and a selection transistor, wherein one end of each phase change variable resistor is connected to one of a plurality of bit lines, and the selection transistor is controlled by a word line and connected to the other end of each phase change variable resistor. The method comprises activating a word line of a selected memory cell to be set programmed to turn on the selection transistor; applying a reset pulse to all bit lines of the selected memory cell; and applying a set pulse to parts of the bit lines of the selected memory cell, which are to be set programmed.

The semiconductor memory device is a phase change memory device formed of a phase change material. Accordingly, according to the present invention, it is possible to increase the integration of the semiconductor memory device.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
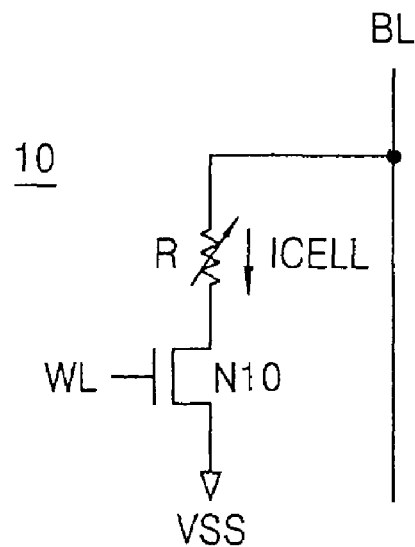
FIG. 1 is a circuit diagram of a conventional phase change memory cell.
Figure 2:
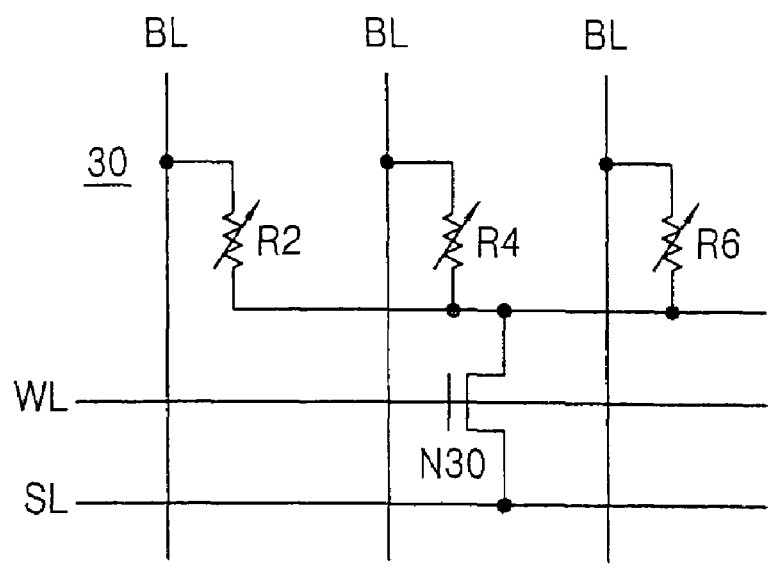
FIG. 2 is a circuit diagram of a conventional non-volatile phase change memory cell.
Figure 3:
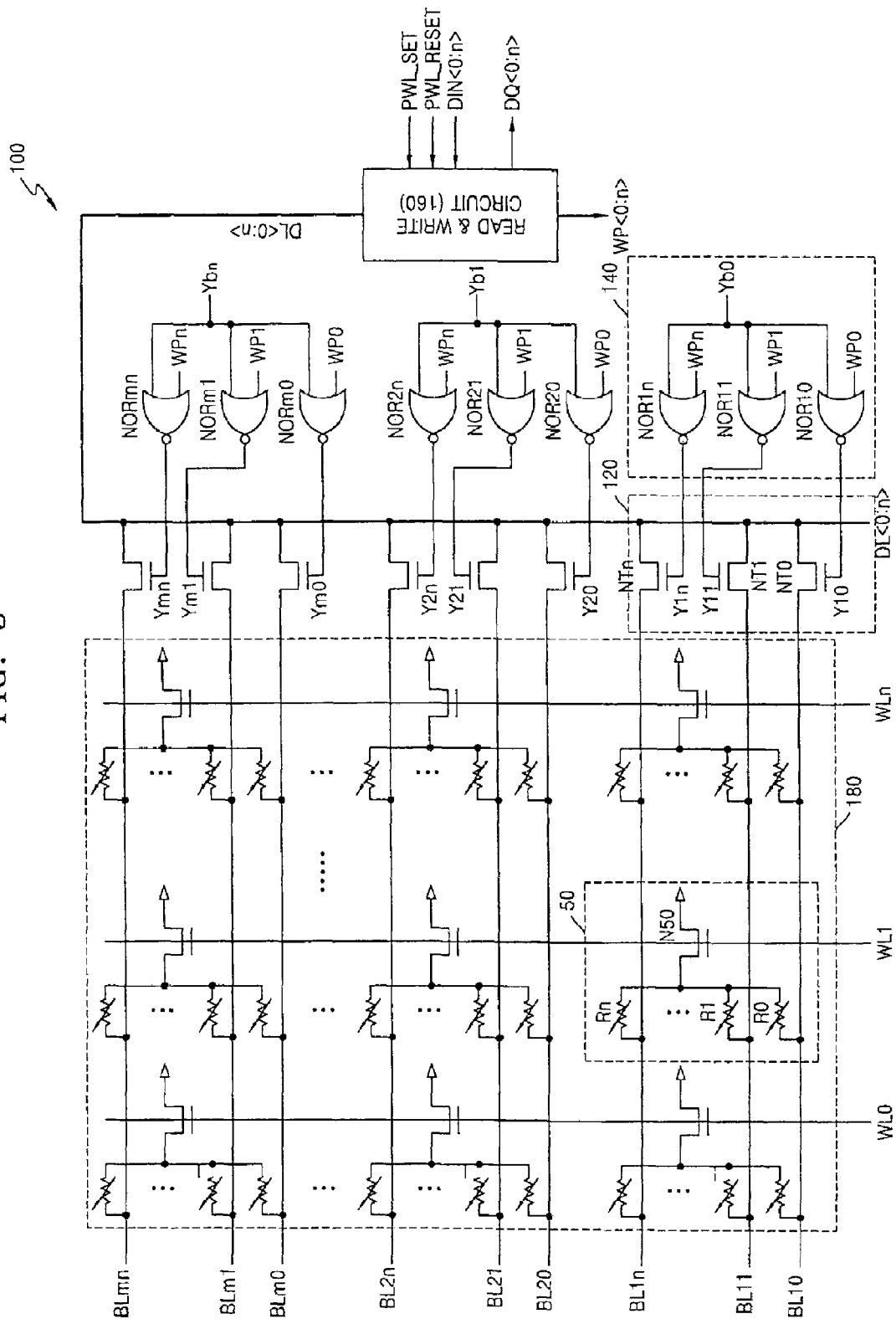
FIG. 3 is circuit diagram of a semiconductor memory device according to one embodiment of the present invention.

FIG. 3 is a circuit diagram of a semiconductor memory device according to an embodiment of the present invention.

The memory device shown in FIG. 3 is a phase change memory device formed of a phase change material.

Referring to FIG. 3, a semiconductor memory device 100 comprises a memory array 180 having a plurality of memory cells 50. Semiconductor memory device 100 further comprises a plurality of column selection circuits 120, each comprising a plurality of N-type metal-oxide semiconductor (NMOS) column selection transistors NT0 through NTn, a plurality of column selection control circuits 140, each comprising a plurality of NOR gates NOR10 through NOR1n, a read/write circuit 160, and a peripheral circuit (not shown) such as a decoder. Collectively, column selection control circuits 140 and read/write circuit constitute a control circuit for controlling reset and set programming operations for memory cells 50.

Each of memory cells 50 comprises a plurality of phase change variable resistors R0 through Rn. Each of phase change variable resistors R0 through Rn has one end connected to a corresponding bit line in a plurality of bit lines BL10 through BLmn, and another end connected to a drain of a selection transistor N50. Selection transistor N50 has a gate connected to one of a plurality of word lines WL0 through WLn and a source connected to a reference voltage (not shown). The number of phase change variable resistors R0 through Rn in each memory cell is typically a multiple of eight.

Bit lines BL10 through BLmn are respectively connected to column selection transistors NT0 through NTn in the plurality of column selection circuits 120 and each of column selection circuits 120 receives column selection signals Y10 through Y1n output by column selection control circuit 140.

Each of column selection control circuits 140 receives a plurality of write data pulses WP0 through WPn from read/write circuit 160, and a plurality of column block signals Yb0 through Ybn from a decoder (not shown).

Although not shown in the drawings, read/write circuit 160 includes a write driver, a sense amplifier, and data input and output buffers used in read and programming operations. Read/write circuit 160 receives external data DIN0 through DINn, and outputs write data pulses WP0 through WPn in response to a reset control signal PWL_RESET and a set control signal PWL_SET. In addition, read/write circuit 160 outputs data read from the plurality of memory cells 50 to the outside of semiconductor memory device 100 via data lines DL0 through DLn.

Figure 4:
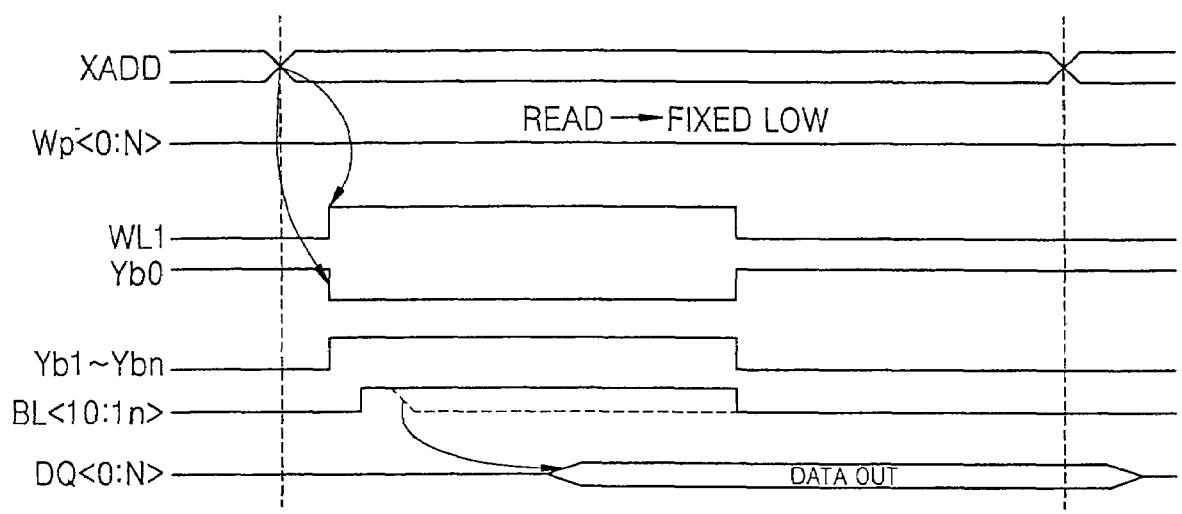
FIG. 4 is a waveform timing diagram illustrating a read operation of the semiconductor memory device shown in FIG. 3 according to an embodiment of the present invention; and, FIG. 5 is a waveform timing diagram illustrating a programming operation of the semiconductor memory device of FIG. 3, according to an embodiment of the present invention.
Figure 5:
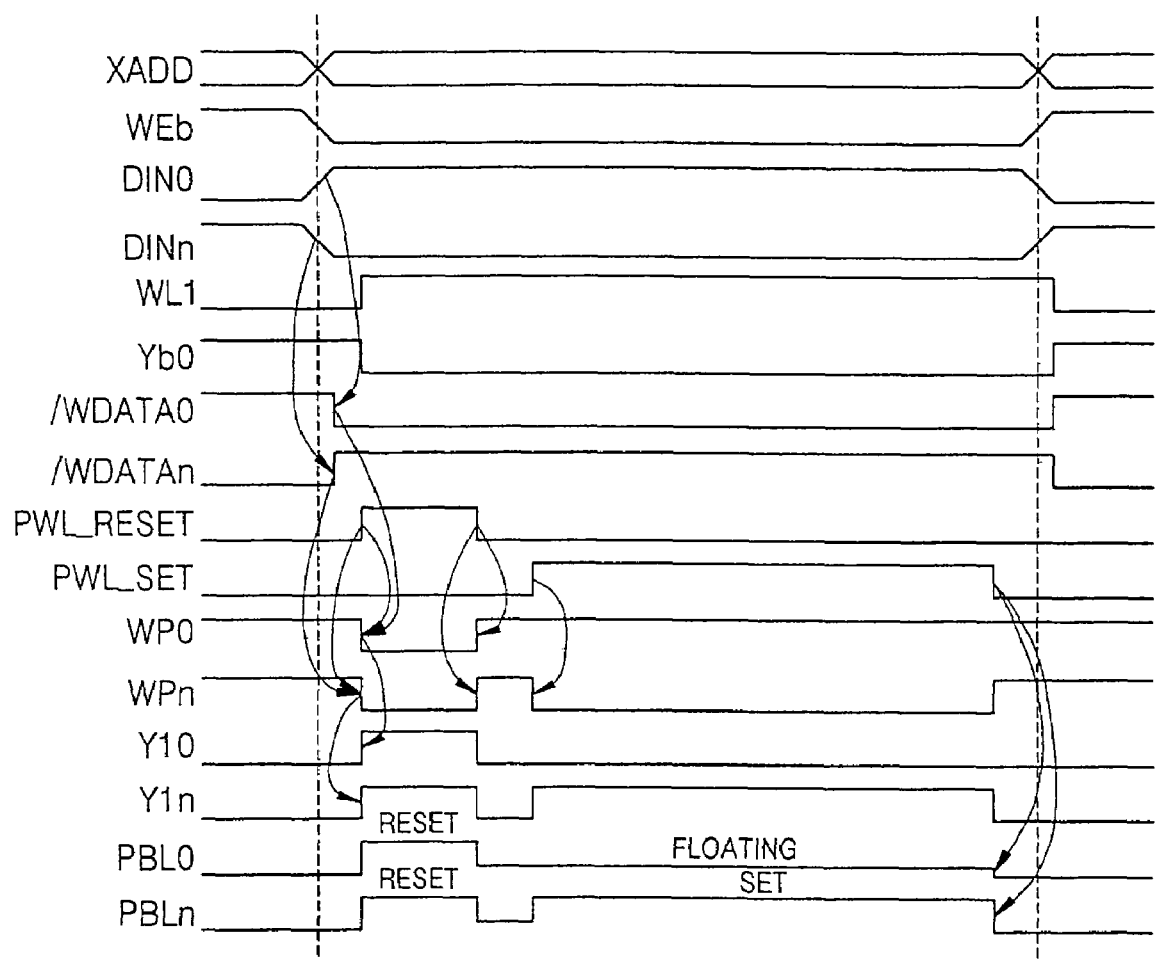

The operation of a semiconductor memory device according to embodiments of the present invention is described in further detail below with reference to FIGS. 3 through 5. FIG. 4 is a waveform timing diagram illustrating a read operation of semiconductor memory device 100 and FIG. 5 is a waveform timing diagram illustrating a programming operation of semiconductor memory device 100. For explanation purposes, it is assumed that the read and programming operations illustrated in FIGS. 4 and 5 are performed on a selected memory cell 50 indicated by a broken box in FIG. 3.

Referring to FIGS. 3 and 4, word line WL1 assumes a second logic state (e.g., a logical "1") and column block signal Yb0 assumes a first logic state (e.g., a logical "0") in response to an input address signal XADD. Meanwhile, write data pulses WP0 through WPn are maintained in the first logic state.

Remaining column block signals Yb1 through Ybn assume the second logic state in response to input address signal XADD, and accordingly, all of column selection signals Y10 through Y1n assume the second logic state, thereby turning on column selection transistors NT0 through NTn.

Under these conditions, a plurality of data signals is read from memory cell 50, amplified by corresponding sense amplifiers (not shown), and output from semiconductor memory device 100 via corresponding bit lines BL10 through BL1n and data lines DL0 through DLn.

In this embodiment, the number of phase change variable resistors per memory cell is a multiple of 8, e.g., 16, 32, or 64.

Memory cell 50 may be fabricated by depositing elements on a semiconductor substrate (not shown). For instance, memory cell 50 may be fabricated by forming selection transistor N50 on the semiconductor substrate and then sequentially depositing phase change variable resistors R0 through Rn on selection transistor N50.

In addition, semiconductor memory device 100 may be integrated together with various other electronic components. For example, it may be installed onto a system LSI logic chip together with a logic chip.

Referring now to FIG. 5, in a programming operation, word line WL1 assumes the second logic state and column block signal Yb0 assumes the first logic state in response to input address signal XADD.

In FIG. 5, it is assumed that high-level data DIN0 is written to phase change variable resistor R0 of memory cell 50, and low-level data DINn is written to phase change variable resistor Rn of memory cell 50. In this case, write data /WDATA0 is at a low level in contrast with the high level of the data DIN0, and write data /WDATAn is at a high level in contrast with the low level of the data DINn. Although not shown in FIG. 3, write data /WDATA0 through /WDATAn is typically related to data DIN0 through DINn as illustrated in FIG. 5. However, the relationship between data DIN0 through DINn and write data /WDATA0 through /WDATAn is not limited to that shown in FIG. 5.

As shown in FIG. 5, write data pulses WP0 and WPn assume the first logic state in response to reset control signal PWL_RESET and write data /WDATA0 and /WDATAn while reset control signal PWL_RESET is in the second logic state. Column selection signals Y10 and Y1n assume the second logic state in response to write data pulses WP0 and WPn.

Column selection transistors NT0 and NTn are turned on in response to column selection signals Y10 and Y1n and reset pulses PBL0 and PBLn are applied to phase change variable resistors R0 and Rn of memory cell 50, thereby resetting phase change variable resistors R0 and Rn.

Write data pulse WPn assumes the first logic state while set control signal PWL_SET and column selection signal Y1n are in the second logic state.

Column selection transistor NTn is turned on when column selection signal Y1n is in the second logic state and a set pulse PBLn is applied to phase change variable resistor Rn of memory cell 50, thus setting phase change variable resistor Rn.

Bit lines BL10 through BLmn are pre-charged to the first logic state in response to a transition (e.g., a falling edge) of set control signal PWL_SET.

In the embodiment of the invention illustrated in FIG. 5, a "set" programming operation is performed on selected memory cell 50 by applying a reset pulse to a phase change variable resistor in response to reset control signal PWL_RESET and then applying a set pulse to the phase change variable resistor in response to set control signal PWL_SET.

According to another embodiment of the present invention, a "reset" programming operation is performed by applying the reset pulse to all phase change variable resistors within the selected memory cell in response to reset control signal PWL_RESET. Then, a set programming operation is performed on the selected memory cell by applying set pulse to all or some of the phase change variable resistors within the selected memory cell in response to set control signal PWL_SET.

According to still another embodiment of the present invention, a set programming operation is performed on a selected memory cell of a semiconductor memory device by activating a word line associated with the selected memory cell so as to turn on a corresponding selection transistor, applying a reset pulse to bit lines of the selected memory cell, and applying a set pulse to bit lines of the selected memory cell which are to be programmed.

Because the above programming operations are similar to those described in relation to FIGS. 4 and 5, additional description thereof will be omitted to avoid redundancy.

As described above, each of the memory cells in a semiconductor memory device according to the present invention includes a plurality of phase change variable resistors, wherein the number of phase change variable resistors in each memory cell is a multiple of 8. Accordingly, the semiconductor memory device is able to achieve a high degree of integration.

The foregoing exemplary embodiments are teaching examples. Those of ordinary skill in the art will understand that various changes in form and details may be made to the exemplary embodiments without departing from the scope of the present invention which is defined by the following claims.

What is claimed:

1. A semiconductor memory device comprising:
a plurality of phase change memory cells, wherein each one of the plurality of phase change memory cells comprises:
a plurality of phase change variable resistors, each one of the plurality of phase change variable resistors comprising a first end connected to one of a plurality of bit lines and a second end connected to a drain of a selection transistor;
wherein the selection transistor has a gate connected to a word line and a source connected to a reference voltage; and
wherein the number of phase change variable resistors in the plurality of phase change variable resistors is equal to a multiple of eight (8).

2. The semiconductor memory device of claim 1, further comprising a plurality of column selection transistors;
wherein each of the column selection transistors is connected between one of the respective bit lines and a data line;
wherein during a read operation, one of the column selection transistors corresponding to a phase change memory cell from which data is to be read is turned on in response to a column block signal and outputs the data to the data line.

3. The semiconductor memory device of claim 2, wherein the column bock signal is activated in response to an address signal indicating the phase change memory cell from which data is to be read.

4. The semiconductor memory device of claim 2, wherein the number of the phase change variable resistors is equal to the number of the column selection transistors.

5. The semiconductor memory device of claim 4, wherein the number of phase change variable resistors is 16.

6. The semiconductor memory device of claim 4, wherein the number of phase change variable resistors is 32.

7. The semiconductor memory device of claim 2, wherein the phase change variable resistors are formed of at least one material selected from a group consisting of germanium (Ge), antimony (Sb), and tellurium (Te).

8. The semiconductor memory device of claim 7, wherein the phase change variable resistors are formed on a semiconductor substrate.

9. The semiconductor memory device of claim 8, wherein the phase change variable resistors are formed on the selection transistor.

10. The semiconductor memory device of claim 2, further comprising a control circuit controlling reset and set programming operations of the semiconductor memory;
wherein during a reset programming operation, the control circuit applies a reset pulse to all phase change variable resistors within a selected phase change memory cell in response to a reset control signal; and
during set programming operation, the control circuit applies a reset pulse to selected phase change variable resistors in the selected phase change memory cell in response to the reset control signal and applies a set pulse to the selected phase change variable resistors in response to a set control signal.

11. The semiconductor memory device of claim 2, further comprising a control circuit controlling reset and set programming operations of the semiconductor memory;
wherein the control circuit comprises:
a plurality of column selection control circuits; and
a read/write circuit;
wherein the plurality of column selection control circuits selects one of the phase change memory cells on which a write operation or a read operation is to be performed in response to the column block signal and controls a set pulse or a reset pulse to be applied to a plurality of phase change variable resistors of the selected phase change memory cell in response to a write data pulse;
wherein the read/write circuit receives the reset control signal, the set control signal, and data, and generates the write data pulse, the set pulse, and the reset pulse.

12. The semiconductor memory device of claim 11, wherein each of the column selection control circuits comprises a plurality of NOR gates receiving the column block signal and a write data pulse and providing an output signal to one of the column selection transistors.

13. The semiconductor memory device of claim 12, wherein the number of the NOR gates in each of the column selection control circuits is equal to the number of phase change variable resistors in each of the phase change memory cells.

14. The semiconductor memory device of claim 13, wherein during a reset programming operation, a column block signal corresponding to an address of the selected phase change memory cell is activated and each of the column selection control circuits activates the write data pulses received by each of the NOR gates to turn on column selection transistors in the selected phase change memory cell; and
during a set programming operation, a reset programming operation is performed on the selected phase change memory cell, the column block signal is activated, and a write data pulse corresponding to the selected phase change variable resistor is activated, thereby turning on corresponding column selection transistors.

15. The semiconductor memory device of claim 14, wherein the bit lines are pre-charged in response to a set control signal.

16. A method of programming a semiconductor memory device comprising a plurality of memory cells, wherein each memory cell comprises a selection transistor and a plurality of phase change variable resistors, wherein the number of phase change variable resistors in each memory cell is multiple of eight (8), the method comprising:

performing a reset programming operation by applying the reset pulse to all phase change variable resistors within a selected memory cell in response to reset control signal; and performing a set programming operation on the selected memory cell by applying set pulse to the phase change variable resistors within the selected memory cell in response to set control signal.

17. The method of claim 16, wherein the phase change variable resistors are formed of at least one material selected from a group consisting of germanium (Ge), antimony (Sb), and tellurium (Te).

18. A method of programming a semiconductor memory device comprising a plurality of memory cells, wherein each memory cell comprises a selection transistor and a plurality of phase change variable resistors, wherein the number of phase change variable resistors is multiple of 8, the method comprising:

performing a reset programming operation by applying the reset pulse to all phase change variable resistors within a selected memory cell in response to reset control signal; and performing a set programming operation on the selected memory cell by applying set pulse to some of the phase change variable resistors within the selected memory cell in response to set control signal.

19. A method of set programming a semiconductor memory device comprising a plurality of memory cells, wherein each of the memory cells comprises a plurality of phase change variable resistors and a selection transistor, wherein each of the phase change variable resistors has a first end connected to one of a plurality of bit lines and a second end connected to a drain of the selection transistor, wherein the selection transistor has a gate connected to a word line and a source connected to a reference voltage, the method comprising:

activating a word line associated with a selected memory cell, thereby turning on the selection transistor;

applying a reset pulse to all bit lines associated with the selected memory cell; and applying a set pulse to selected bit lines associated with the selected memory cell.

20. The method of claim 19, wherein the phase change variable resistors are formed of at least one material selected from a group consisting of germanium (Ge), antimony (Sb), and tellurium (Te).

21. The method of claim 19, wherein the number of phase change resistors in each memory cell is a multiple of eight (8).

* * * * *